(12) United States Patent
Wang et al.

(10) Patent No.: US 12,329,046 B2
(45) Date of Patent: Jun. 10, 2025

(54) RESISTIVE MEMORY STRUCTURE COMPRISING VARIABLE RESISTANCE AND HARD MASK LAYERS

(71) Applicant: United Microelectronics Corp., Hsinchu (TW)

(72) Inventors: Wen-Jen Wang, Tainan (TW); Chun-Hung Cheng, Kaohsiung (TW); Chuan-Fu Wang, Miaoli County (TW)

(73) Assignee: United Microelectronics Corp., Hsinchu (TW)

( * ) Notice: Subject to any disclaimer, the term of this patent is extended or adjusted under 35 U.S.C. 154(b) by 403 days.

(21) Appl. No.: 17/750,425

(22) Filed: May 23, 2022

(65) Prior Publication Data

US 2023/0354724 A1    Nov. 2, 2023

(30) Foreign Application Priority Data

Apr. 28, 2022 (CN) .......................... 202210462950.0

(51) Int. Cl.
   *H10N 70/00*   (2023.01)
   *H10D 1/47*    (2025.01)

(52) U.S. Cl.
   CPC .......... *H10N 70/841* (2023.02); *H10D 1/474* (2025.01); *H10N 70/8833* (2023.02); *H10N 70/023* (2023.02); *H10N 70/026* (2023.02)

(58) Field of Classification Search
   CPC .... H10N 70/841; H10N 70/061; H10N 70/20; H10N 70/023; H10N 70/026; H10N 70/826; H10N 70/8833; H01L 28/24

USPC .................................. 257/273; 438/189, 309
See application file for complete search history.

(56) References Cited

U.S. PATENT DOCUMENTS

| | | | |
|---|---|---|---|
| 9,147,836 B2 | 9/2015 | Greene et al. | |
| 9,269,897 B2 | 2/2016 | Clark | |
| 9,349,953 B2 | 5/2016 | Tu et al. | |
| 9,431,604 B2 | 8/2016 | Liao et al. | |
| 9,673,255 B2 | 6/2017 | Jo et al. | |
| 9,780,302 B2 | 10/2017 | Chen et al. | |
| 9,799,705 B1* | 10/2017 | Yi | H10N 70/841 |
| 2010/0277969 A1* | 11/2010 | Li | H10N 70/8833 257/2 |
| 2013/0064001 A1* | 3/2013 | Terai | G11C 13/004 257/E47.001 |
| 2014/0098594 A1* | 4/2014 | Azuma | G11C 13/004 365/148 |
| 2014/0264233 A1* | 9/2014 | Tu | H10N 70/841 257/4 |
| 2020/0127189 A1* | 4/2020 | Liao | H10N 70/8836 |

(Continued)

*Primary Examiner* — Didarul A Mazumder
(74) *Attorney, Agent, or Firm* — JCIPRNET

(57) ABSTRACT

Provided is a resistive memory structure and a manufacturing method thereof. The resistive memory structure includes a substrate, a dielectric layer, a resistive memory device, a hard mask layer, and a spacer. The dielectric layer is located on the substrate. The dielectric layer has an opening. The resistive memory device is located in the opening and has a protrusion outside the opening. The resistive memory device includes a first electrode, a variable resistance layer, and a second electrode. The variable resistance layer is located on the first electrode. The second electrode is located on the variable resistance layer. The hard mask layer covers a top surface of the variable resistance layer. The spacer covers a sidewall of the variable resistance layer in the protrusion.

18 Claims, 8 Drawing Sheets

(56) References Cited

U.S. PATENT DOCUMENTS

2021/0351348 A1\* 11/2021 Hsu ..................... H10N 70/063
2022/0059762 A1\* 2/2022 Yang ..................... H10B 63/20

\* cited by examiner

RESISTIVE MEMORY STRUCTURE COMPRISING VARIABLE RESISTANCE AND HARD MASK LAYERS

CROSS-REFERENCE TO RELATED APPLICATION

This application claims the priority benefit of China patent application serial no. 202210462950.0, filed on Apr. 28, 2022. The entirety of the above-mentioned patent application is hereby incorporated by reference herein and made a part of this specification.

BACKGROUND

Technical Field

The disclosure relates to a semiconductor structure and a manufacturing method thereof, particularly to a resistive memory structure and a manufacturing method thereof.

Description of Related Art

Currently, some processes of resistive memory devices are integrated with those of logic devices. And in the case where the processes of the resistive memory devices are integrated with those of the logic devices, the height of the interconnect structure of the logic device corresponding to the interconnect structure electrically connected to the resistive memory device may vary. As a result, the value of the resistive-capacitive delay (RC delay) of the logic device would also vary, resulting in an unexpected electrical performance of the logic devices.

SUMMARY

The disclosure provides a resistive memory structure and a manufacturing method thereof capable of preventing variation in the height of an interconnect structure in a logic device region.

The disclosure provides a resistive memory structure including a substrate, a dielectric layer, a resistive memory device, a hard mask layer, and a spacer. The dielectric layer is located on the substrate and has an opening. The resistive memory device is located in the opening and has a protrusion located outside the opening. The resistive memory device includes a first electrode, a variable resistance layer, and a second electrode. The variable resistance layer is located on the first electrode. The second electrode is located on the variable resistance layer. The hard mask layer covers a top surface of the variable resistance layer. The spacer covers a sidewall of the variable resistance layer in the protrusion.

According to an embodiment of the disclosure, the variable resistance layer in the resistive memory structure may be further located on a top surface of the dielectric layer.

According to an embodiment of the disclosure, in the resistive memory structure, the top surface of the variable resistance layer is coplanar with a top surface of the second electrode.

According to an embodiment of the disclosure, the variable resistance layer in the resistive memory structure includes a single-layer structure.

According to an embodiment of the disclosure, the variable resistance layer in the resistive memory structure includes a multi-layer structure.

According to an embodiment of the disclosure, in the resistive memory structure, the variable resistance layer has a recess, and the second electrode is located in the recess.

According to an embodiment of the disclosure, the first electrode in the resistive memory structure may be located between the variable resistance layer and the dielectric layer.

According to an embodiment of the disclosure, the cross-sectional shape of the resistive memory device in the resistive memory structure includes a T-shaped.

According to an embodiment of the disclosure, the first electrode in the resistive memory structure includes a single-layer structure.

According to an embodiment of the disclosure, the first electrode in the resistive memory structure includes a multi-layer structure.

According to an embodiment of the disclosure, in the resistive memory structure, the first electrode includes a barrier layer and a conductive layer, and the conductive layer is located on the barrier layer.

According to an embodiment of the disclosure, the material of the barrier layer in the resistive memory structure includes, for example, titanium (Ti), titanium nitride (TiN), tantalum (Ta), tantalum nitride (TaN), or a combination thereof.

According to an embodiment of the disclosure, the material of the conductive layer in the resistive memory structure includes, for example, iridium (Ir).

According to an embodiment of the disclosure, the material of the variable resistance layer in the resistive memory structure includes, for example, tantalum oxide (TaOx).

According to an embodiment of the disclosure, the material of the second electrode in the resistive memory structure includes, for example, titanium nitride (TiN), tantalum nitride (TaN), or a combination thereof.

According to an embodiment of the disclosure, the material of the spacer in the resistive memory structure includes, for example, silicon nitride.

According to an embodiment of the disclosure, the material of the hard mask layer in the resistive memory structure includes, for example, silicon nitride.

According to an embodiment of the disclosure, the resistive memory structure further includes a first interconnect structure and a second interconnect structure. The first interconnect structure is electrically connected to the first electrode, and the second interconnect structure is electrically connected to the second electrode. The overall height of the second interconnect structure and the resistive memory device may be identical to the height of the first interconnect structure.

The disclosure provides a manufacturing method of a resistive memory structure, which includes the following steps: A substrate is provided. A dielectric layer is formed on the substrate, and the dielectric layer has an opening. A resistive memory device is formed in the opening, and the resistive memory device has a protrusion outside the opening. The resistive memory device includes a first electrode, a variable resistance layer, and a second electrode. The variable resistance layer is located on the first electrode, and the second electrode is located on the variable resistance layer. A hard mask layer is formed, and the hard mask layer covers a top surface of the variable resistance layer. A spacer is formed, and the spacer covers a sidewall of the variable resistance layer in the protrusion.

According to an embodiment of the disclosure, in the manufacturing method of the resistive memory structure, forming the resistive memory device includes the following steps. A first electrode material layer is formed on the dielectric layer and in the opening. A variable resistance material layer is formed on the first electrode material layer, and the variable resistance material layer may have a recess. A second electrode material layer is formed on the variable resistance material layer and in the recess. A planarization process is performed on the second electrode material layer to form the second electrode and expose the variable resistance material layer. The variable resistance material layer and the first electrode material layer are patterned to form the variable resistance layer and the first electrode.

Based on the above, in the resistive memory structure and the manufacturing method thereof proposed by the disclosure, as the resistive memory device in the memory region is located in the opening of the dielectric layer, the height of the interconnect structure in the logic device region may be prevented from having variation. In this way, variation in the value of the RC delay of the logic device may be prevented, and the logic device may have an electrical performance as expected. In addition, as the hard mask layer covers the top surface of the variable resistance layer and the spacer covers the sidewall of the variable resistance layer in the protrusion, damage to the variable resistance layer by moisture may be prevented.

To make the features and advantages of the disclosure more comprehensible, the following embodiments are described in detail with reference to the following drawings.

DESCRIPTION OF THE EMBODIMENTS

FIG. 1A to FIG. 1H are cross-sectional views of the manufacturing flow of a resistive memory structure according to some embodiments of the disclosure.

Figure 1A:
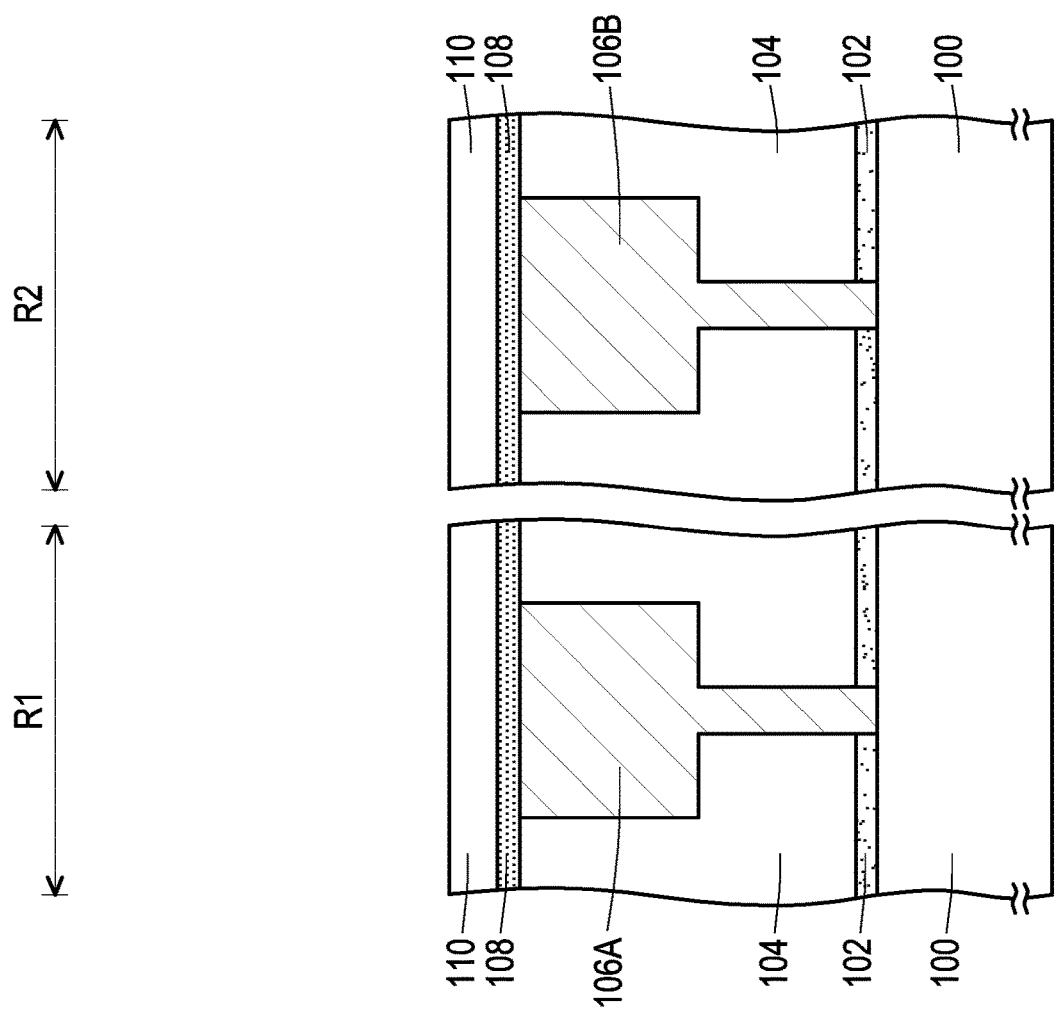
FIG. 1A to FIG. 1H are cross-sectional views of the manufacturing flow of a resistive memory structure according to some embodiments of the disclosure.

In FIG. 1A, a substrate 100 is provided. The substrate 100 may include a memory region R1. The memory region R1 may be a resistive memory region, such as a resistive random access memory (RRAM) region. In some embodiments, the substrate 100 may further include a logic device region R2. In addition, the required logic devices (not shown) may be provided on the substrate 100 in the logic device region R2. The substrate 100 may be a semiconductor substrate, such as a silicon substrate.

In some embodiments, a stop layer 102 may be formed on substrate 100. The material of the stop layer 102 includes, for example, a nitrogen doped carbide (NDC) material, such as silicon carbide nitride (SiCN). The forming process of the stop layer 102 includes, for example, a chemical vapor deposition (CVD) process. In some embodiments, a dielectric layer 104 may be formed on the stop layer 102. The material of the dielectric layer 104 includes, for example, silicon oxide or a material with a low dielectric constant. The forming process of the dielectric layer 104 includes, for example, a CVD process. In some embodiments, an interconnect structure 106A may be formed in the dielectric layer 104 and the stop layer 102. The interconnect structure 106A may be located in the memory region R1. In some embodiments, the interconnect structure 106B may be formed in the dielectric layer 104 and the stop layer 102. The interconnect structure 106B may be located in the logic device region R2. The interconnect structure 106A and the interconnect structure 106B may respectively include contacts, vias, wires, or a combination thereof. The material of the interconnect structure 106A and the interconnect structure 106B includes, for example, a conductive material such as copper. In some embodiments, the interconnect structure 106A and the interconnect structure 106B may be formed by an interconnect process. In some embodiments, the interconnect structure 106A and the interconnect structure 106B may be formed by a dual damascene process.

Although not shown in FIG. 1A, the substrate 100 may have components required for semiconductor devices (e.g., active devices and/or passive devices), other interconnect structures, and/or other dielectric layers, etc., and its description is omitted herein. The interconnect structure 106A may be electrically connected to a corresponding interconnect structure (not shown) or a semiconductor device (not shown), and the interconnect structure 106B may be electrically connected to the corresponding interconnect structure (not shown) or the semiconductor device (not shown).

Next, a stop layer 108 may be formed on the substrate 100. In some embodiments, stop layer 108 may be formed on the dielectric layer 104, and the stop layer 108 may also be formed on the interconnect structure 106A and the interconnect structure 106B. The material of the stop layer 108 includes, for example, a nitrogen-doped carbide (NDC) material, such as silicon carbide nitride (SiCN). The forming process of the stop layer 108 includes, for example, a CVD process.

Then, a dielectric layer 110 is formed on the substrate 100. In some embodiments, the dielectric layer 110 may be formed on the stop layer 108. The material of the dielectric layer 110 includes, for example, silicon oxide or a material with a low dielectric constant. The forming process of the dielectric layer 110 includes, for example, a CVD process.

Figure 1B:
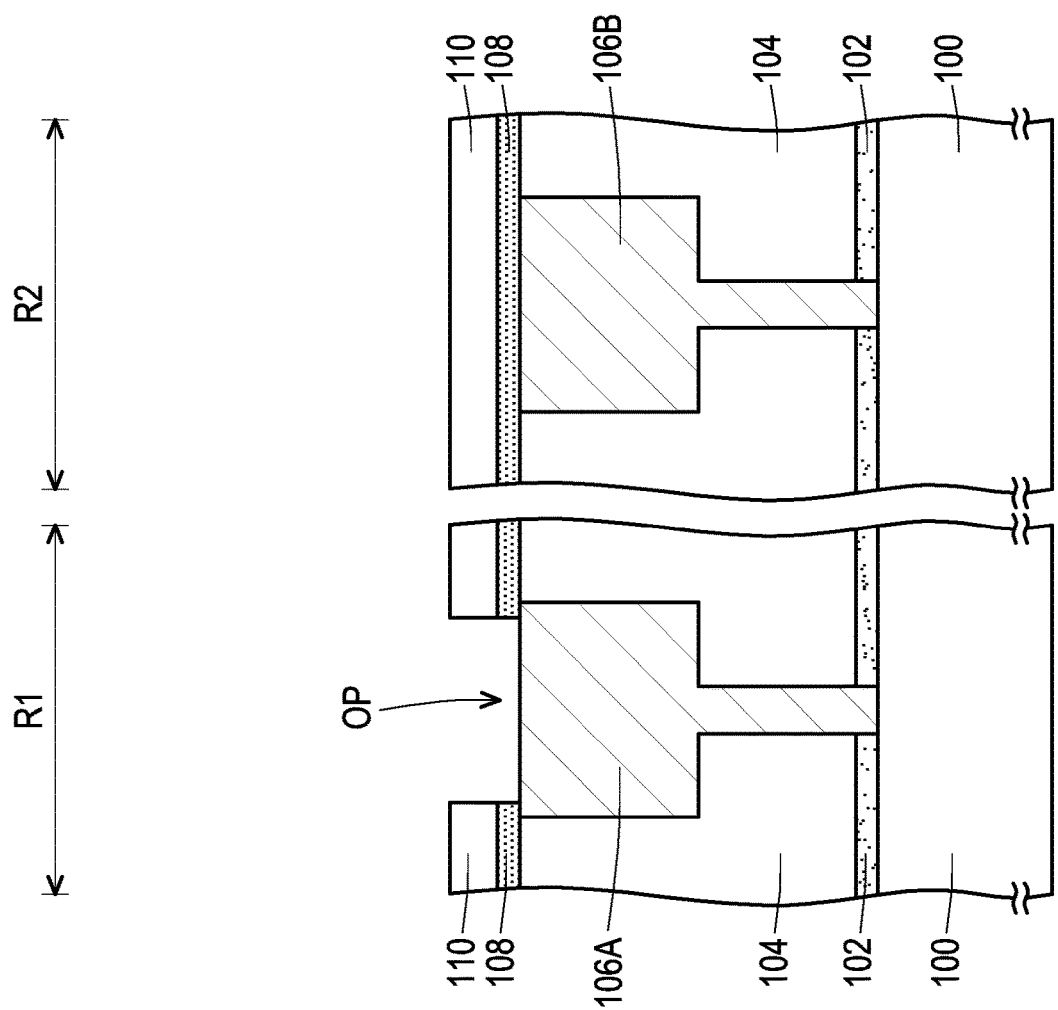

In FIG. 1B, an opening OP is formed in the dielectric layer 110. Thus, the dielectric layer 110 may have the opening OP. The opening OP may be located in the memory region R1. In some embodiments, the opening OP may also be formed in the stop layer 108 and may expose the interconnect line structure 106A. In some embodiments, the opening OP may be formed by patterning the dielectric layer 110 and the stop layer 108 through a photolithography process and an etching process.

Figure 1C:
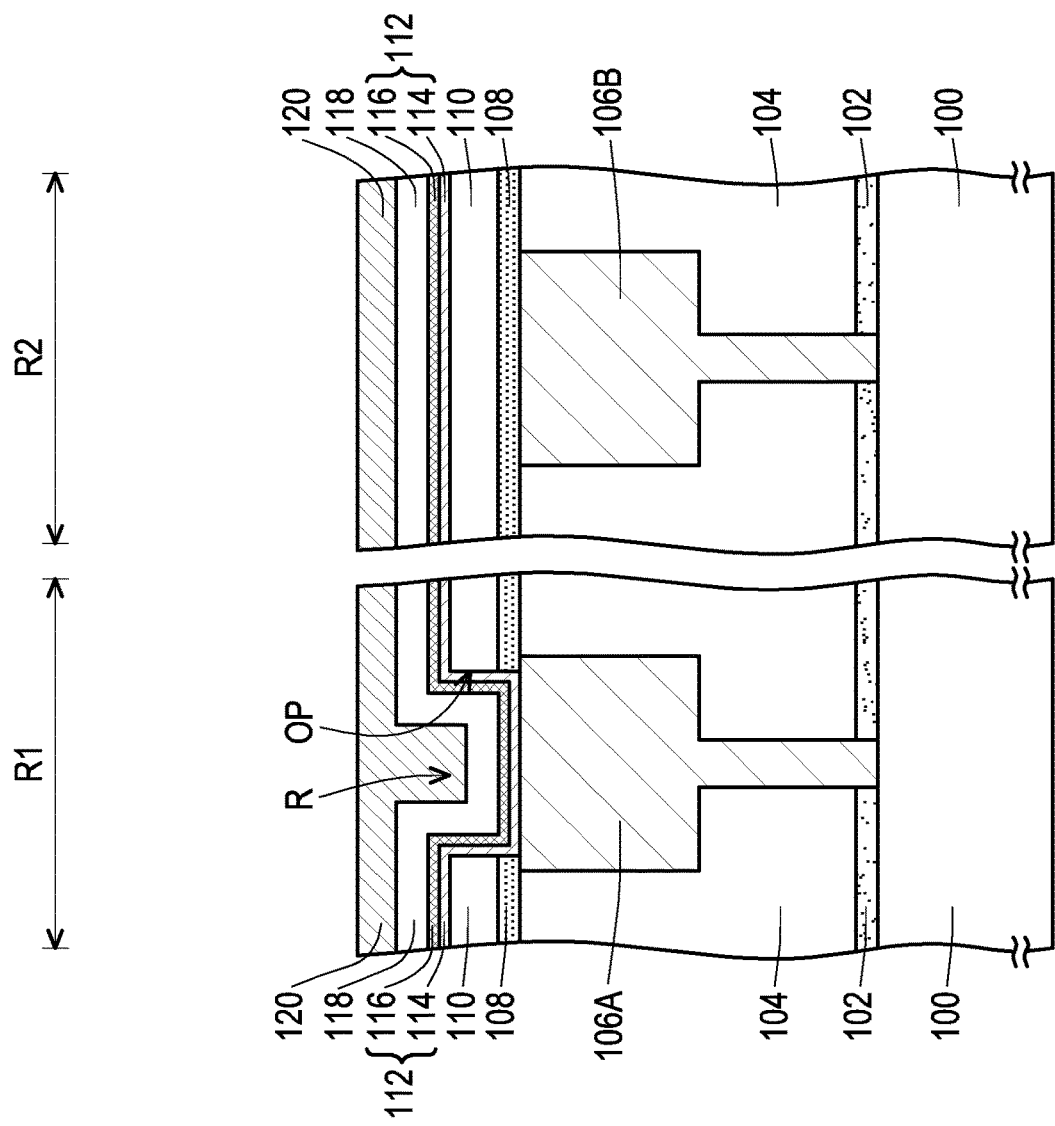

In FIG. 1C, an electrode material layer 112 may be formed on the dielectric layer 110 and in the opening OP. In addition, the electrode material layer 112 may also be formed on the interconnect structure 106A. The electrode material layer 112 may have a single-layer structure or a multi-layer structure. In this embodiment, the electrode material layer 112 is a multi-layer structure. For example, the electrode material layer 112 may include a barrier material layer 114 and a conductive material layer 116, but the disclosure is not limited thereto. The material of the barrier material layer 114 includes, for example, titanium (Ti), titanium nitride (TiN), tantalum (Ta), tantalum nitride (TaN), or a combination thereof. The forming process of the barrier material layer 114 includes, for example, a physical vapor deposition (PVD) process. The conductive material layer 116 is located on the barrier material layer 114. The material of the conductive material layer 116 includes, for example, iridium (Ir). The forming process of the conductive material layer 116 includes, for example, a PVD process.

Next, a variable resistance material layer 118 may be formed on the electrode material layer 112. The variable resistance material layer 118 may have a recess R. The variable resistance material layer 118 may be a single-layer structure or a multi-layer structure. The material of the variable resistance material layer 118 includes, for example, tantalum oxide (TaOx). The forming process of the variable resistance material layer 118 includes, for example, a PVD process.

Then, an electrode material layer 120 may be formed on the variable resistance material layer 118 and in the recess R. The material of the electrode material layer 120 includes, for example, titanium nitride (TiN), tantalum nitride (TaN), or a combination thereof. The forming process of the electrode material layer 120 includes, for example, a PVD process.

Figure 1D:
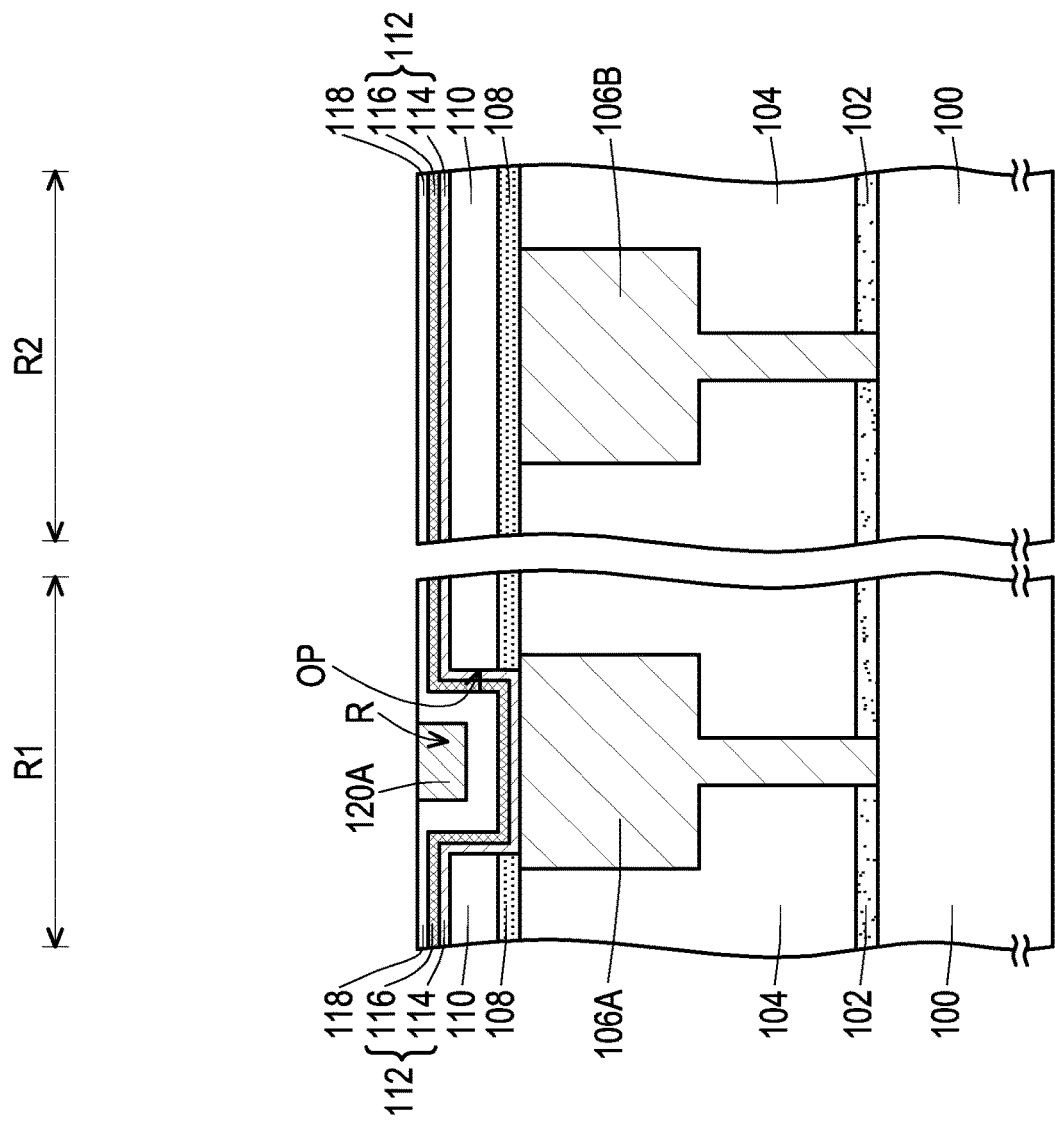

In FIG. 1D, a planarization process may be performed on the electrode material layer 120 to form an electrode 120A and expose the variable resistance material layer 118. The planarization process includes a chemical mechanical planarization (CMP) process.

Figure 1E:
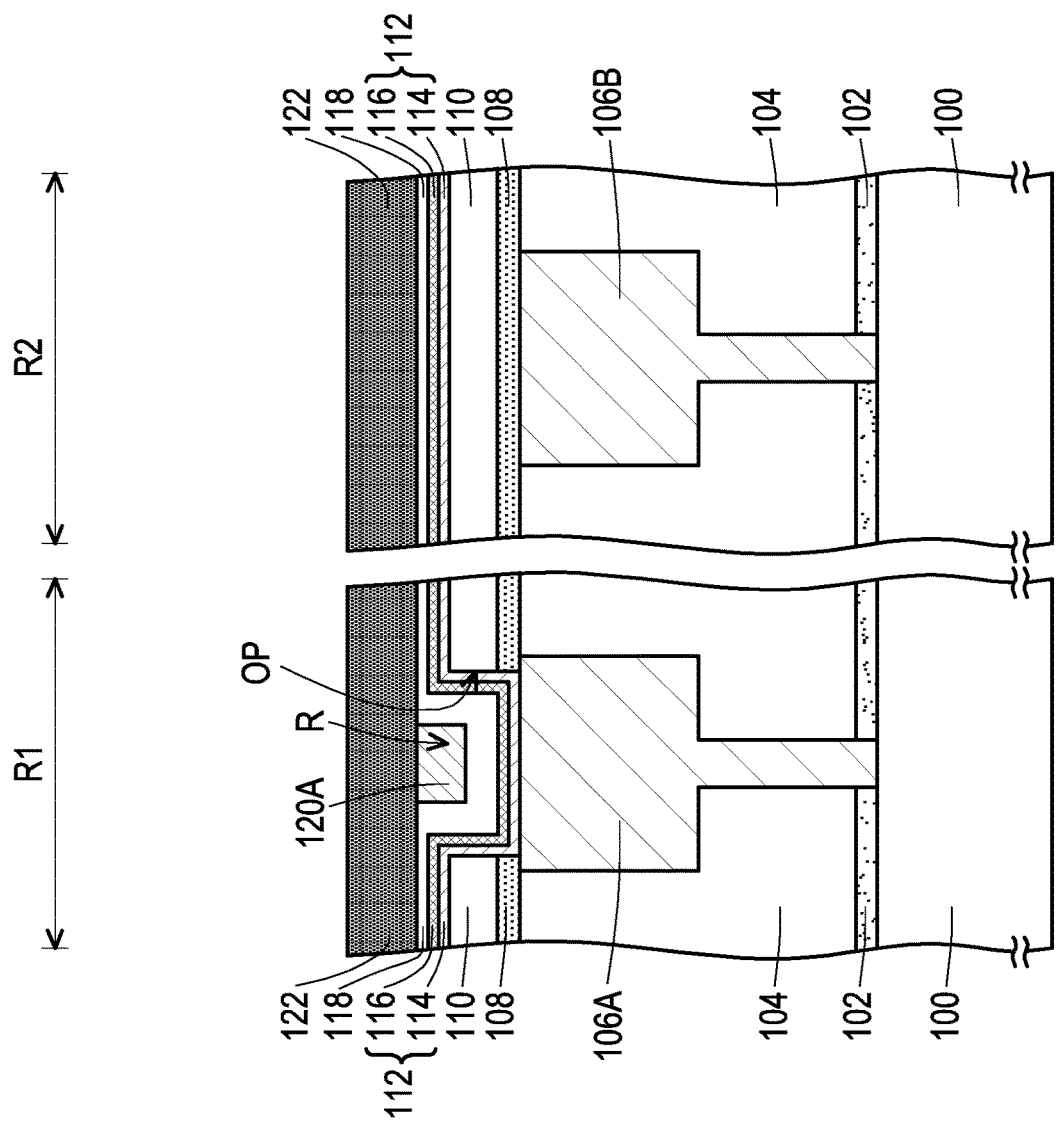

In FIG. 1E, a hard mask material layer 122 may be formed on the variable resistance material layer 118 and the electrode 120A. The material of the hard mask material layer 122 includes, for example, silicon nitride. The forming process of the hard mask material layer 122 includes, for example, a CVD process.

Figure 1F:
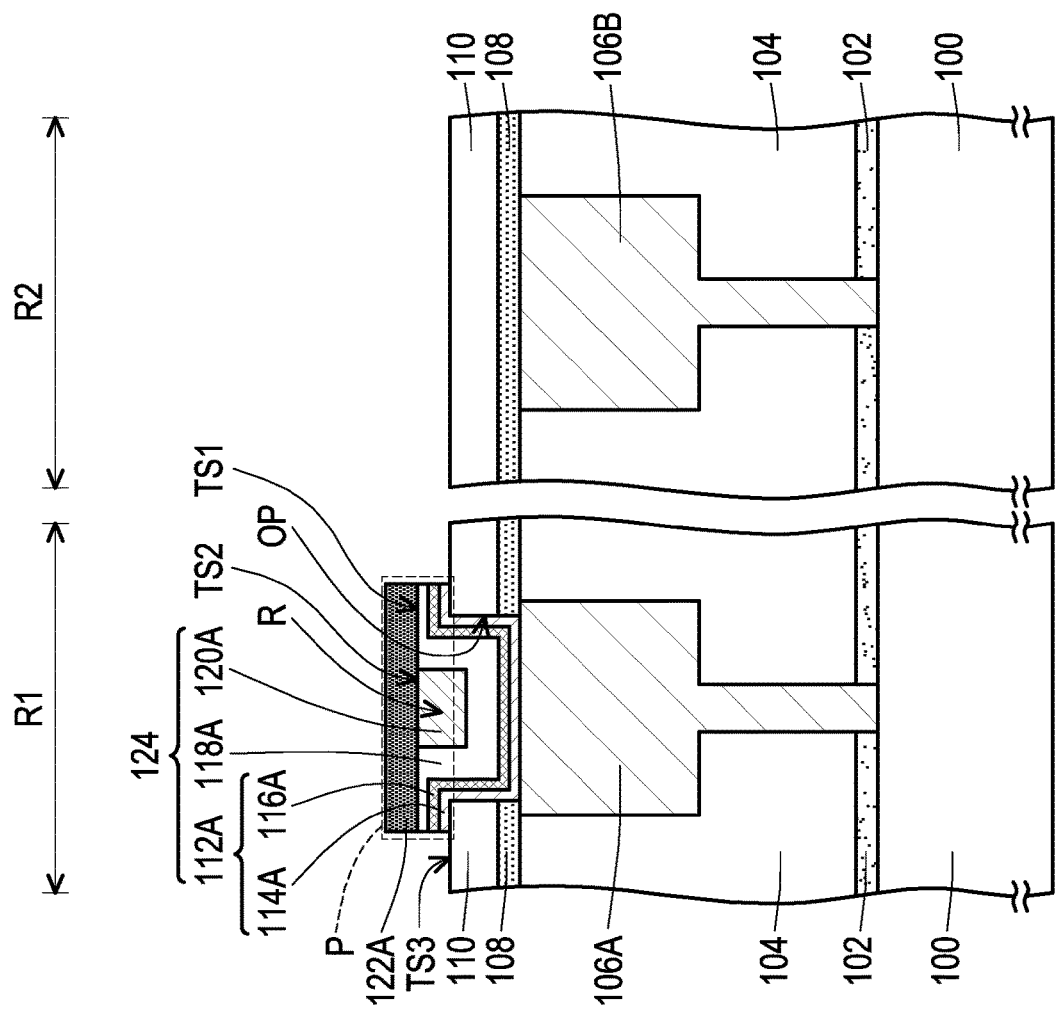

In FIG. 1F, the hard mask material layer 122, the variable resistance material layer 118, and the electrode material layer 112 may be patterned to form a hard mask layer 122A, a variable resistance layer 118A, and an electrode 112A. Thus, the resistive memory device 124 may be formed in the opening OP. The resistive memory device 124 may be located in the memory region R1. The resistive memory device 124 has a protrusion P located outside the opening OP. In some embodiments, the cross-sectional shape of the resistive memory device 124 is T-shaped. In some embodiments, the resistive memory device 124 may be a resistive random access memory (RRAM) device. In some embodiments, the hard mask material layer 122, the variable resistance material layer 118, and the electrode material layer 112 in the logic device region R2 are removed during the patterning process of the hard mask material layer 122, the variable resistance material layer 118, and the electrode material layer 112. In some embodiments, the hard mask material layer 122, the variable resistance material layer 118, and the electrode material layer 112 may be patterned by a photolithography process and an etching process.

The resistive memory device 124 includes the electrode 112A, the variable resistance layer 118A, and the electrode 120A. The electrode 112A may be located on the dielectric layer 110 and in the opening OP. Additionally, the electrode 112A may also be located on the interconnect structure 106A. The electrode 112A may have a single-layer structure or a multi-layer structure. In this embodiment, the electrode 112A is a multi-layer structure. For example, the electrode 112A may include a barrier layer 114A and a conductive layer 116A, but the disclosure is not limited thereto. The barrier layer 114A may be located on the dielectric layer 110 and in the opening OP. Additionally, the barrier layer 114A may also be located on the interconnect structure 106A. The material of the barrier layer 114A includes, for example, titanium (Ti), titanium nitride (TiN), tantalum (Ta), tantalum nitride (TaN), or a combination thereof. The conductive layer 116A is located on barrier layer 114A. The material of the conductive layer 116A includes, for example, iridium (Ir).

The variable resistance layer 118A is located on the electrode 112A. The top surface TS1 of the variable resistance layer 118A and the top surface TS2 of the electrode 120A may be coplanar. The variable resistance layer 118A may also be located on the top surface TS3 of the dielectric layer 110. The electrode 112A may be located between the variable resistance layer 118A and the dielectric layer 110.

The variable resistance layer 118A may have a single-layer structure or a multi-layer structure. The variable resistance layer 118A may have a recess R. The material of the variable resistance layer 118A includes, for example, tantalum oxide (TaOx). The electrode 120A is located on the variable resistance layer 118A. The electrode 120A may be located in the recess R. The material of the electrode 120A includes, for example, titanium nitride (TiN), tantalum nitride (TaN), or a combination thereof. The hard mask layer 122A covers the top surface TS1 of the variable resistance layer 118A, and the hard mask layer 122A may also cover the top surface TS2 of the electrode 120A. The material of the hard mask layer 122A includes, for example, silicon nitride.

Figure 1G:
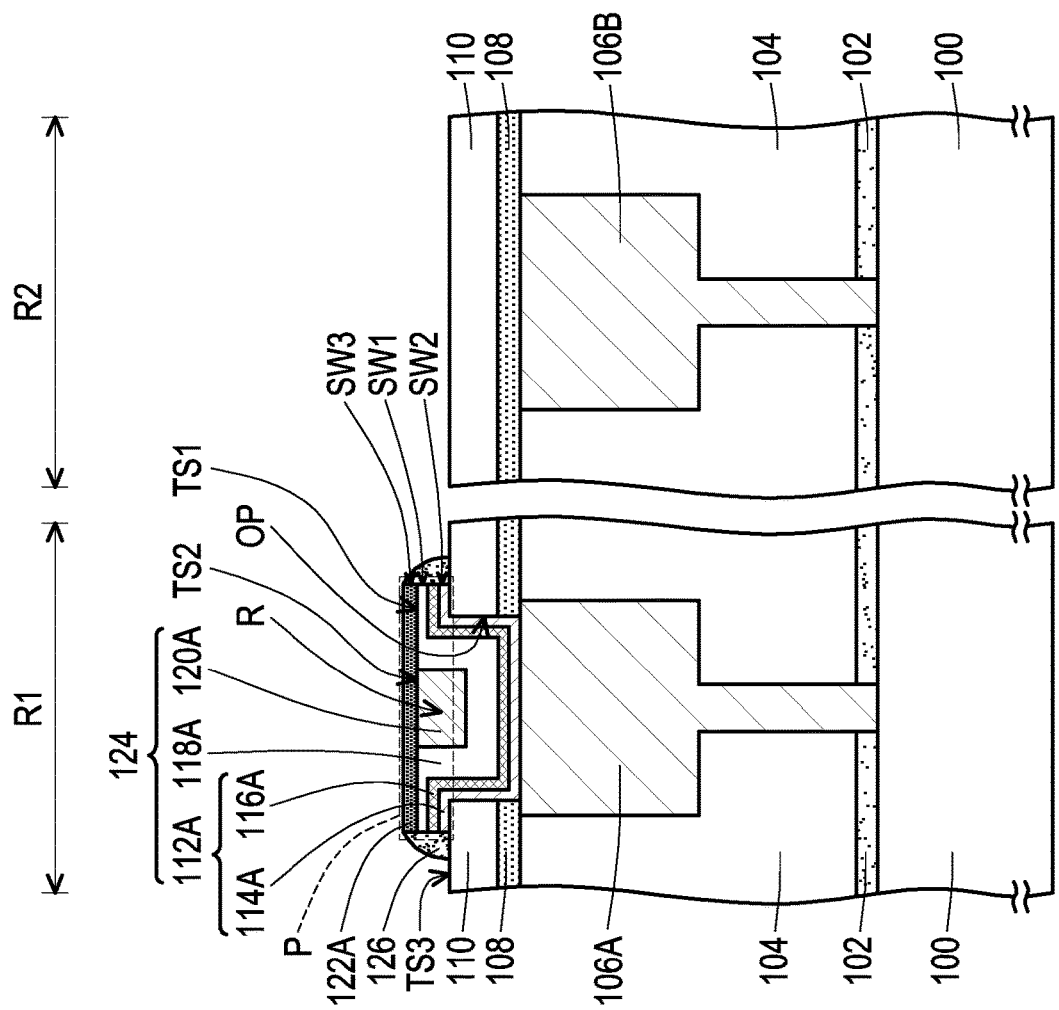

In FIG. 1G, a spacer 126 is formed. The spacer 126 covers the sidewall SW1 of the variable resistance layer 118A in the protrusion P. In addition, the spacer 126 may also cover the sidewall SW2 of the electrode 112A in the protrusion P, and the spacer 126 may also cover the sidewalls SW3 of the hard mask layer 122A. The material of the spacer 126 includes, for example, silicon nitride. In some embodiments, the forming process of the spacer 126 may include the following steps, but the disclosure is not limited thereto. First, a spacer material layer (not shown) may be formed on the hard mask layer 122A, the sidewalls SW1 of the variable resistance layer 118A, the sidewalls SW2 of the electrode 112A, and the dielectric layer 110. Next, an etch-back process is performed on the spacer material layer to form the spacer 126. In some embodiments, the thickness of the hard mask layer 122A is also reduced during the process of forming the spacer 126.

Figure 1H:
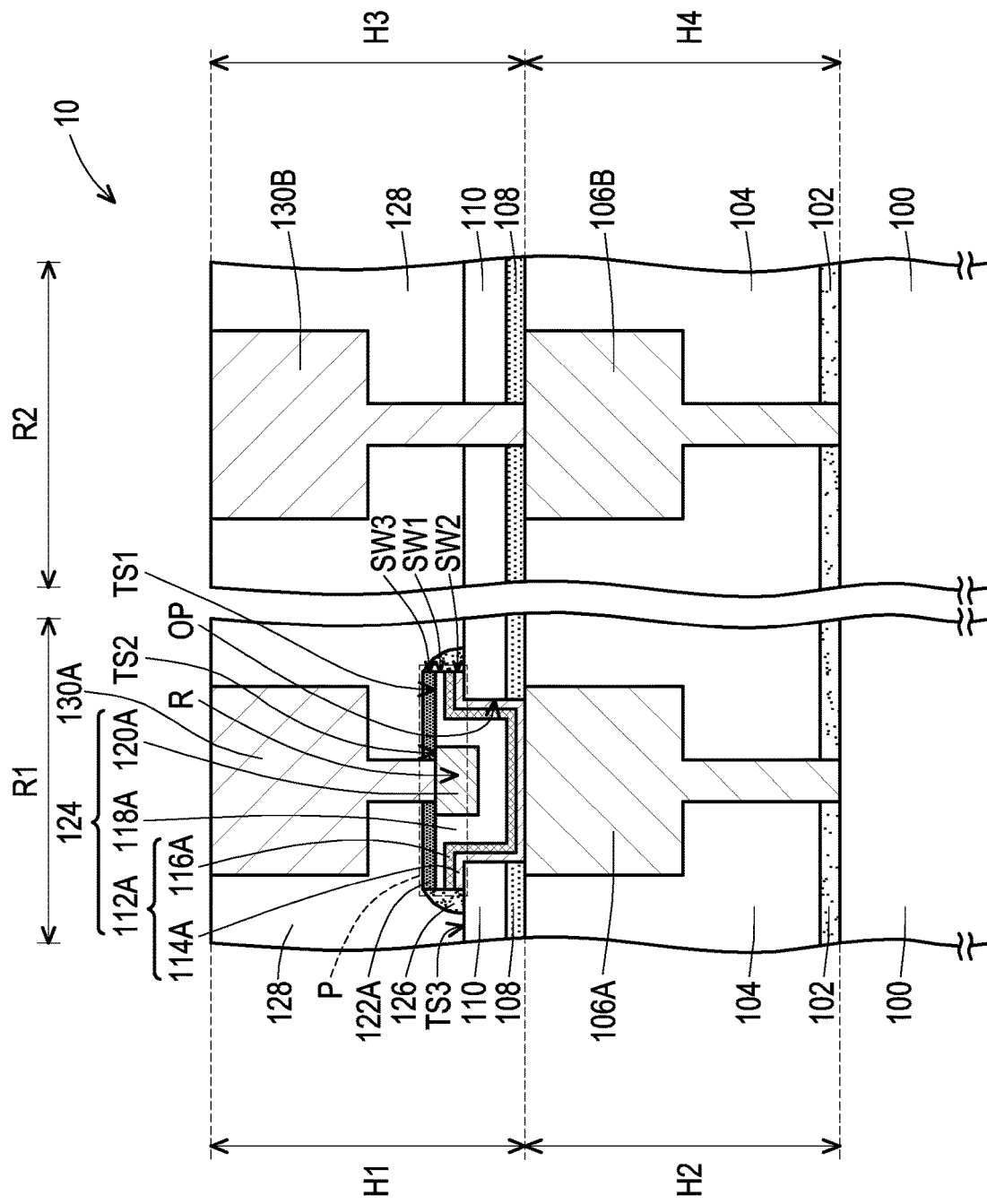

In FIG. 1H, a dielectric layer 128 may be formed on the dielectric layer 110, the hard mask layer 122A, and the spacer 126. The material of the dielectric layer 128 includes, for example, silicon oxide or a material with a low dielectric constant. The forming process of the dielectric layer 128 includes, for example, a CVD process.

In some embodiments, an interconnect structure 130A may be formed in the dielectric layer 128 and the hard mask layer 122A. The interconnect structure 130A may be located in the memory region R1. The interconnect structure 130A may be electrically connected to the electrode 120A. In some embodiments, an interconnect structure 130B may be formed in the dielectric layer 128, the dielectric layer 110, and the stop layer 108. The interconnect structure 130B may be located in the logic device region R2. The interconnect structure 130B may be electrically connected to the interconnect structure 106B. The interconnect structure 130A and the interconnect structure 130B may respectively include vias, wires, or a combination thereof. The material of the interconnect structure 130A and the interconnect structure 130B includes, for example, a conductive material such as copper. In some embodiments, the interconnect structure 130A and the interconnect structure 130B may be formed by an interconnect process. In some embodiments, the interconnect structure 130A and the interconnect structure 130B are formed by a dual damascene process.

The semiconductor structure 10 of the above embodiment is described with reference to FIG. 1H hereinafter. Although the forming process of the semiconductor structure 10 is described by taking the above method as an example, the disclosure is not limited thereto.

In FIG. 1H, the resistive memory structure 10 includes a substrate 100, a dielectric layer 110, a resistive memory device 124, a hard mask layer 122A, and a spacer 126. The dielectric layer 110 is located on the substrate 100. The dielectric layer 110 has an opening OP. The resistive memory device 124 is located in the opening OP. The resistive memory device 124 has a protrusion P located outside the opening OP. The resistive memory device 124 includes an electrode 112A, a variable resistance layer 118A, and an electrode 120A. The variable resistance layer 118A is located on the electrode 112A. The electrode 120A is located on variable resistance layer 118A. The hard mask layer 122A covers the top surface TS1 of the variable resistance layer 118A, and the spacer 126 covers the sidewall SW1 of the variable resistance layer 118A in the protrusion P.

In some embodiments, the resistive memory structure 10 further includes the interconnect structure 106A and the interconnect structure 130A. The interconnect structure 106A and the interconnect structure 130A may be located in the memory region R1. The interconnect structure 106A is electrically connected to the electrode 112A, and the interconnect structure 130A is electrically connected to the electrode 120A. In some embodiments, the overall height H1 of the interconnect structure 130A and the resistive memory device 124 is identical to the height H2 of the interconnect structure 106A. In this embodiment, "identical" means "substantially the same," and "substantially" means that the situation where a tolerable difference caused by the actual manufacturing process is allowable.

In some embodiments, the resistive memory structure 10 further includes an interconnect structure 106B and an interconnect structure 130B. The interconnect structure 106B and the interconnect structure 130B may be located in the logic device region R2. The interconnect structure 130B is electrically connected to the interconnect structure 106B. In some embodiments, the height H3 of the interconnect structure 130B is identical to the height H4 of the interconnect structure 106B. In some embodiments, the height H3 of the interconnect structure 130B is identical to the total height H1 of the interconnect structure 130A and the resistive memory device 124. In some embodiments, the height H4 of the interconnect structure 106B is identical to the height H2 of the interconnect structure 106A.

Please refer to the descriptions of the above embodiments for the rest of the components of the resistive memory structure 10. As the resistive memory structure 10 (e.g., its materials, configuration relationships, and formation) have been described in detail in the above embodiments, the same is not repeated herein.

Based on the above embodiments, in the resistive memory structure 10 and the manufacturing method thereof, the height variation of the interconnect structure 130B in the logic device region R2 may be prevented as the resistive memory device 124 in the memory region R1 is located in the opening OP of the dielectric layer 110. For example, the height H3 of the interconnect structure 130B may be identical to the height H4 of the interconnect structure 106B. In this way, variation in the value of the RC delay of the logic device may be prevented, such that the logic device can have an electrical performance as expected. In addition, as the hard mask layer 122A covers the top surface TS1 of the variable resistance layer 118A, and the spacer 126 covers the sidewall SW1 of the variable resistance layer 118A in the protrusion P, the variable resistance layer 118A may be prevented from being damaged by moisture.

In summary, in the resistive memory structure and the manufacturing method thereof in the embodiments, the height variation of the interconnect structure in the logic device region may be prevented as the resistive memory device in the memory region is located in the opening of the dielectric layer. In this way, variation in the value of the RC delay of the logic device may be prevented, such that the logic device can have an electrical performance as expected. In addition, as the hard mask layer and the spacer respectively cover the top surface and the sidewall of the variable resistance layer, the variable resistance layer may be prevented from being damaged by moisture.

Although the disclosure has been disclosed by the embodiments above, they are not meant to limit the disclosure, and any person skilled in the art can make changes and modifications without departing from the spirit and scope of the disclosure. Therefore, the protection scope of the disclosure should be determined by the claims.

What is claimed is:

1. A resistive memory structure, comprising:
   a substrate;
   a dielectric layer located on the substrate and having an opening;
   a resistive memory device located in the opening and having a protrusion located outside the opening, wherein the resistive memory device comprises:
   a first electrode;
   a variable resistance layer located on the first electrode; and
   a second electrode located on the variable resistance layer;
   a hard mask layer covering a top surface of the variable resistance layer; and
   a spacer covering a sidewall of the variable resistance layer in the protrusion, wherein
   the second electrode is columnar,
   the variable resistance layer has a horizontally extending protrusion portion,
   a top surface of the horizontally extending protrusion portion is coplanar with a top surface of the second electrode, and
   the horizontally extending protrusion portion protrudes and extends in a direction parallel to the top surface of the second electrode.

2. The resistive memory structure according to claim 1, wherein the variable resistance layer is further located on a top surface of the dielectric layer.

3. The resistive memory structure according to claim 1, wherein the top surface of the variable resistance layer is coplanar with the top surface of the second electrode.

4. The resistive memory structure according to claim 1, wherein the variable resistance layer comprises a single-layer structure.

5. The resistive memory structure according to claim 1, wherein the variable resistance layer comprises a multi-layer structure.

6. The resistive memory structure according to claim 1, wherein:
   the variable resistance layer has a recess, and
   the second electrode is located in the recess.

7. The resistive memory structure according to claim 1, wherein the first electrode is located between the variable resistance layer and the dielectric layer.

8. The resistive memory structure according to claim 1, wherein a cross-sectional shape of the resistive memory device comprises a T shape.

9. The resistive memory structure according to claim 1, wherein the first electrode comprises a single-layer structure.

10. The resistive memory structure according to claim 1, wherein the first electrode comprises a multi-layer structure.

11. The resistive memory structure according to claim 10, wherein the first electrode comprises:
   a barrier layer; and
   a conductive layer located on the barrier layer.

12. The resistive memory structure according to claim 11, wherein a material of the barrier layer comprises titanium, titanium nitride, tantalum, tantalum nitride, or a combination thereof.

13. The resistive memory structure according to claim 11, wherein a material of the conductive layer comprises iridium.

14. The resistive memory structure according to claim 1, wherein a material of the variable resistance layer comprises tantalum oxide.

15. The resistive memory structure according to claim 1, wherein a material of the second electrode comprises titanium nitride, tantalum nitride, or a combination thereof.

16. The resistive memory structure according to claim 1, wherein a material of the spacer comprises silicon nitride.

17. The resistive memory structure according to claim 1, wherein a material of the hard mask layer comprises silicon nitride.

18. The resistive memory structure according to claim 1, further comprising:
   a first interconnect structure electrically connected to the first electrode; and
   a second interconnect structure electrically connected to the second electrode, wherein
   an overall height of the second interconnect structure and the resistive memory device is identical to a height of the first interconnect structure.

* * * * *